… … … … … … … … … … … … … …

United States Patent [19]
Gardner et al.

[11] Patent Number: 5,948,599
[45] Date of Patent: *Sep. 7, 1999

[54] METHOD OF FORMING AN IMAGE IN A PRINTING PLATE

[76] Inventors: Alastair Lamont Gardner, Flat 2, 32 Oakwood Ave., Leeds, United Kingdom, LS8 2HZ; Allen Peter Gates, 13 Fountains Way, Knaresborough, North Yorkshire, United Kingdom, HG5 8HU; Andrew Ernest Matthews, C/O Post Office Whatawhata, Hamilton, New Zealand; Jacek Paul Obuchowicz, 4 Beechwood Rd., Mirfield, West Yorkshire, United Kingdom, WF14 9JX

[*] Notice: This patent issued on a continued prosecution application filed under 37 CFR 1.53(d), and is subject to the twenty year patent term provisions of 35 U.S.C. 154(a)(2).

[21] Appl. No.: 08/592,156

[22] Filed: Jan. 26, 1996

Related U.S. Application Data

[63] Continuation of application No. 08/153,389, Nov. 16, 1993, abandoned.

[30] Foreign Application Priority Data

Nov. 18, 1992 [GB] United Kingdom ................... 9224204

[51] Int. Cl.⁶ ...................................................... G03C 5/00
[52] U.S. Cl. .......................... 430/330; 430/138; 430/300; 430/910
[58] Field of Search ................................... 430/330, 138, 430/910, 300

[56] References Cited

U.S. PATENT DOCUMENTS

| | | | |
|---|---|---|---|
| 3,580,719 | 5/1971 | Brinckman | 430/325 |
| 3,811,773 | 5/1974 | Vrancken | 355/132 |
| 4,004,924 | 1/1977 | Vrancken et al. | 430/325 |
| 4,868,016 | 9/1989 | Lorah et al. | 427/287 |
| 4,956,252 | 9/1990 | Fryd et al. | 430/325 |
| 5,085,976 | 2/1992 | Gibson et al. | 430/306 |

FOREIGN PATENT DOCUMENTS

| | | |
|---|---|---|
| 2068546 | 11/1992 | Canada . |
| 2068586 | 11/1992 | Canada . |
| 0 489 553 A1 | 6/1992 | European Pat. Off. . |
| 0 514 145 A1 | 11/1992 | European Pat. Off. . |
| 60-68992 | 4/1985 | Japan . |
| 887356 | 1/1962 | United Kingdom . |
| 1139891 | 1/1969 | United Kingdom . |
| 1139894 | 1/1969 | United Kingdom . |
| 1548764 | 4/1976 | United Kingdom . |
| 2077452 | 12/1981 | United Kingdom . |

OTHER PUBLICATIONS

Abstract, Shuhei Shiraishi, Thermal Recording Materials, Aug. 28, 1986, p. 117, Japan.

Abstract, Shuhei Shiraishi and Tsugio Yamaoka, Screen–printing Plate, Oct. 13, 1986, p. 113, Japan.

Abstract, Shiro Yamane and Giichi Kaneko, Lithographic Original Plates with a Heat–sensitive Recording Layer, Mar. 23, 1988, p. 65, Japan.

Abstract, Shiro Yamane, Massahiro Sato and Fumiaki Arai, Thermal Recording–type Lithographic Plates Comprising Inorganic Pigment and Binder Containing Graft Copolymer and Polymer, Japan.

*Primary Examiner*—Maria Nuzzolillo
*Assistant Examiner*—Laura Weiner

[57] ABSTRACT

A method of image formation which comprises (a) providing a radiation sensitive plate comprising a substrate and a coating containing a heat softenable disperse phase, an aqueous soluble or swellable continuous phase and a radiation absorbing substance, (b) image-wise exposing the plate to at least partially coalesce the particles of the disperse phase in the image areas, (c) developing the image-wise exposed plate to remove the coating in the unexposed areas, and (d) heating the developed plate or subjecting it to irradiation to effect insolubilization of the image. Good quality images of high durability are obtained.

13 Claims, No Drawings

METHOD OF FORMING AN IMAGE IN A PRINTING PLATE

This is a continuation of application Ser. No. 08/153,389, filed Nov. 16, 1993 now abandoned.

This invention relates to image formation and is concerned with the formation of images directly from electronically composed digital sources.

For many years it has been a long term aim in the printing industry to form; printing images directly from an electronically composed digital database i.e. by a so-called "computer-to-plate" system. The advantages of such a system over the traditional methods of making printing plates are:

(i) the elimination of the costly intermediate silver film and processing chemicals;

(ii) a saving of time, and (iii) the ability to automate the system with consequent reduction in labour costs.

The introduction of laser technology provided the first opportunity to form an image directly on a printing plate precursor by directing a laser beam at sequential areas of the plate precursor and modulating the beam so as to vary its intensity. In this way, radiation sensitive plates comprising a high sensitivity photocrosslinkable polymer coating have been exposed to water cooled UV argon-ion lasers and electrophotographic plates having sensitivity stretching from the visible spectral region into the near infra-red region have been successfully exposed using low powered air-cooled argon-ion and semiconductor laser devices.

Imaging systems are also available which involve a sandwich structure which, on exposure to a heat generating infra-red laser beam, undergoes selective (image-wise) delamination and a subsequent transfer of materials. Such so-called peel-apart systems are generally used as replacements for silver halide films.

According to one aspect of the present invention, there is provided a radiation sensitive plate which comprises a substrate coated with:

(i) a layer which comprises (1) a disperse phase comprising a water-insoluble heat softenable component (A) and (2) a binder or continuous phase consisting of a component (B) which is soluble or swellable in aqueous, preferably aqueous alkaline, medium, at least one of components A and B including a reactive grouping or precursor therefor, such that insolubilisation of the layer occurs at elevated temperature and/or on exposure to actinic radiation, and (ii) a substance capable of strongly absorbing radiation and transferring the energy thus obtained as heat to the disperse phase so that at least partial coalescence of the coating occurs.

The plate may contain one or more of said layers and/or one or more additional layers so as to increase adhesion to the substrate, improve resistance to abrasion, or to improve the performance of the system in other respects.

The components A and B are preferably polymers and/or oligomers, at least one of which contains reactive groupings or precursors, thus providing a system in which at least one of the following conditions is fulfilled:

a) Component A is crosslinkable;

b) Component B is crosslinkable;

c) Component A reacts with component B to form a crosslinked structure;

d) Component A is a mixture of materials A1, A2, A3, etc. which are either mutually reactive and/or react with component B;

e) Component B is a mixture of materials B1, B2, B3, etc. which are either mutually reactive and/or react with component A.

According to another aspect of the present invention, there is provided a method of forming an image which comprises:

(a) providing a radiation sensitive plate as hereinabove defined, (b) image-wise exposing the radiation-sensitive plate to a beam of high intensity radiation, by directing the radiation at sequential areas of the coating and modulating the radiation so that the particles in the coating are selectively at least partially coalesced, (c) developing the image-wise exposed plate with aqueous medium to selectively remove the areas containing the non-coalesced particles and leave an image on the substrate resulting from the at least partially coalesced particles, and (d) heating the developed plate and/or subjecting it to actinic radiation to effect insolubilisation.

The substrate material used depends upon the purpose for which the image is to be used and may be, for example, formed of metal or plastics material. In the case where the image is to be used as a printing image, the substrate is preferably electrochemically treated aluminium.

The layer contains discrete domains of components A and B. The discontinuous phase A is encapsulated by the continuous phase B. The two phases A and B may form a core-shell system, as described in our earlier European Patent Specification No. 0 514 145-A, in which case the core and shell components may be linked together via chemical bonding. Under ambient conditions, both components are preferably solid and immobile.

Component B may, for example, be incorporated in the composition of the invention through its use as a binder in predispersed pigmentary material added to the composition as the radiation-absorbing substance.

In practice, it is desirable to select components such that the components of the coating will not react sufficiently under normal storage conditions to hinder the imaging and development processes, but will react sufficiently rapidly at elevated temperatures to give a durable, solvent resistant image. This lack of reactivity at ambient temperature may result from the mutually reactive groups being present each in a distinct domain, so that reaction only occurs on coalescence; thus, premature reaction is effectively prevented by the use of separate phases. In the alternative, stability may be achieved by the incorporation of a system such that commencement of reaction only occurs on reaching and exceeding a specified threshold temperature. The component A is an oleophilic polymer or oligomer, preferably having a minimum film forming temperature (MFT) above ambient temperature, and it may be an addition copolymer comprising residues derived from one or more monomers which may, by way of illustration, be selected from one or more groups from each of (i) and (ii) below:

(i) Styrene, substituted styrenes, esters of (meth)acrylic acid, vinyl halides, (meth)acrylonitrile, vinyl esters;

(ii) Glycidyl (meth)acrylate, allyl glycidyl ether, allyl (meth)acrylate, chloromethylstyrene, isocyanate and blocked isocyanate functional materials e.g. isocyanatoethyl methacrylate and its phenol blocked derivative, amino functional monomers e.g. dimethylaminoethyl methacrylate, methacrylamido glycolate methyl ether (Magme; American Cyanamid), N-methylol acrylamide and its derivatives.

Alternatively, component A may be a bisphenol A epichlorohydrin epoxy resin or other suitable epoxy group-containing polymer, or may be derived from a condensation polymer such as a polyester or polyurethane with (optionally blocked) reactive side or terminal groups.

The component B is preferably polymeric and contains carboxylic acid, sulphonamido, or other groups capable of conferring solubility, or at least swellability, in aqueous solutions. Particularly suitable materials for component (B) are:

(i) copolymers derived from the copolymerisation of one or more ethylenically unsaturated carboxylic acids with one or more of styrene, substituted styrenes, (meth)acrylate esters, (meth)acrylonitrile or vinyl acetate;

(ii) dicarboxylic acid half-esters of hydroxyl group-containing polymers, such as phthalic, succinic or maleic acid half esters of a polyvinyl acetal and, in particular, of a polyvinyl butyral; and (iii) alkyl or aralkyl half esters of styrene- or alkyl vinyl ether-maleic anhydride copolymers, in particular alkyl half esters of styrene-maleic anhydride copolymers such as Scripset 540 (Monsanto).

When component B comprises a mixture of components B1, B2, B3, etc., at least one of these components must be polymeric. The other components may also be polymeric, but may additionally include non-polymeric crosslinking agents, for example azides, low molecular weight polyepoxides or, most preferably, melamine crosslinking agents such as hexamethoxy methyl melamine.

The continuous and discontinuous phases may be prepared using core-shell polymerisation techniques as described in our earlier European Patent Specification No. 0 514 145-A, or may be obtained by simple mixing of components A and B after particle formation. The weight ratio of component B to component A may be in the range of from 1:20 to 20:1, and preferably is in the range of from 1:9 to 1:1.

The layer may be formed on the substrate using either aqueous or non-aqueous vehicles, or mixtures thereof, in order to obtain a radiation sensitive plate. It is important, however, that component A should be insoluble in the chosen vehicle or mixture.

In an embodiment, the source of the high intensity radiation is a laser operating in the ultra-violet, visible or infra-red region of the spectrum. Red and infra-red light emitting lasers are preferred, for example the semiconductor or diode lasers typical of which is the gallium aluminium arsenide laser which operates in the 750–870 nm region.

The radiation-absorbing substance may be present in the same layer or layers as components A and B, or it may be present in a separate but adjacent layer. Examples of suitable laser radiation absorbing substances are carbon black and graphite and phthalocyanine, croconium and squarylium type dyestuffs, and mixtures of these products.

The radiation-absorbing substance is present in an amount which is effective to cause some coalescence of the coating under the influence of the high intensity radiation. Generally, the radiation absorbing substance will constitute from 2.0 to 80%, by weight, of the coating.

Preferred developers for selectively removing the non-coalesced material in the non-image areas are aqueous alkalis, such as solutions of ethanolamine and sodium metasilicate, an alkaline phosphate such as sodium phosphate, or an alkali metal hydroxide in water.

The following examples illustrate the invention:

EXAMPLE 1

To a 500 ml flanged flask equipped with condenser, mechanical stirrer, and $N_2$ inlet/exit was charged 250 ml of distilled water, 1.5 g of sodium lauryl sulphate and 0.75 g of ammonium persulphate. The temperature was raised to 70° C. and a nitrogen blanket was applied. 71.2 g of styrene and 3.744 g of glycidyl methacrylate were mixed together and pumped into the aqueous surfactant solution so that the addition took 1½ hours.

The pump was washed through with 50 ml of distilled water and the mixture was maintained, with stirring under $N_2$ at 70° C. for a further two hours.

The resultant latex had a monomer content of <0.01% a particle size<300 nm and a solids content of 20%. 50 g of an 8% w/w solids content coating mixture was prepared from:

12 g of the polymer dispersion;

9.75 g of a 16.4% solids Microlith Black CWA dispersion; (prepared by stirring Microlith Black CWA pigment (a carbon black pigment) from Ciba Geigy Pigments, Manchester UK with $H_2O$/Isopropanol and then adding ammonia);

13.25 g distilled water;

15 g IPA (isopropyl alcohol)

and was coated onto a grained and anodised aluminium substrate to give a coat weight of 0.9 $gm^{-2}$. In this case, component A was a styrene/glycidyl methacrylate copolymer and component B was the alkali-soluble binder associated with the carbon black pigment. The plate was exposed by an array of 32×100 mW laser diodes (Creo Products Inc. Burnaby, Canada) at a nominal 10 micron beam width to effect at least partial coalescence of the particles in the layer in the radiation-struck areas.

A very high quality image was obtained after development in a sodium metasilicate based developer (Unidev, from DuPont-Howson) to remove the non-coalesced areas of the layer.

The plate was baked for two minutes at 200° C., then finished with an acidified solution of an anionic surfactant (Unifin, from DuPont-Howson). The plate had developed good resistance to solvents such as toluene and 1-methoxy-2-propanol and give in excess of 100,000 copies on a web offset press.

The obtained plates were very stable on storage, i.e. they could still be imaged and decoated many months after preparation. The baking response was not diminished significantly.

EXAMPLE 2

Example 1 was repeated except that the plate was treated with a pre-bake solution (Thermotect, from DuPont-Howson) prior to baking for two minutes at 200° C. Again, a storage-stable plate, showing good resistance to solvents and excellent run length, was obtained.

EXAMPLE 3

Example 1 was repeated except that 3 g of bromotrichloromethane was added to the monomers before the addition. Excellent image quality and solvent resistance was again obtained.

EXAMPLE 4

This example illustrates the use of a two layer system.

The coating mixture prepared in Example 1 was coated onto a grained and anodised aluminium substrate to give a coat weight of 0.4 $gm^{-2}$. This was overcoated with 1.0 $gm^{-2}$ of the latex prepared in Example 1. The plate was exposed as in Example 1 to give an excellent image that was baked for two minutes at 200° C.

EXAMPLE 5

To a 500 ml flanged flask equipped with a condenser, mechanical stirrer, thermometer, a nitrogen inlet/outlet and two monomer feed tubes was charged 250 ml of distilled water, 1.5 g of sodium lauryl sulphate, 0.9 g of ascorbic acid and 1.48 g of potassium persulphate. The temperature was raised to 35° C. and a nitrogen blanket was applied. Simultaneously, a mixture of 71.2 g styrene and 3 g bromotrichloromethane (feed 1) and a solution of N-methylolacrylamide (3.8 g of a 10% solution in distilled water) (feed 2) were added at such a rate that the additions of feeds 1 and 2 were completed at the same time over 1½ hours. The mixture was maintained with stirring under nitrogen at 70° C. for a further 2 hours. The resultant latex was of fine particle size and had a solids content of 20%.

The resultant latex was blended with an equal quantity of the latex prepared in Example 1 to give a crosslinking system. 50 g of a coating solution was prepared from:

12 g of the above latex blend;

9.75 g of a 16.4% solids Microlith Black CWA dispersion;

13.25 g distilled water;

15 g isopropyl alcohol;

and was coated onto a grained and anodised aluminium substrate to give a coat weight of 0.9 gm$^{-2}$. The plate was exposed, developed and baked as in Example 1.

EXAMPLE 6

In a 500 ml flask equipped as in Example 1 were placed 43 ml of Carboset XL37 (alkali soluble carboxylated acrylic resin, available from B.F Goodrich, 35% solids dispersion). 200 ml of distilled water and 10 ml of 25% $NH_3$ were added and the mixture was stirred until clear. 0.9 g ascorbic acid and 1.48 g of potassium persulphate were added.

A mixture of styrene (71.21 g), glycidyl methacrylate (3.744 g) and bromotrichloromethane (3 g) was added and the temperature raised to 35° C. under an atmosphere of nitrogen. The temperature was maintained at 35° C. for seven hours. A fine particle size latex of low monomer content was obtained. The solids content was 25% w/w.

A 9% solids dispersion was prepared by mixing 21.6 g of the above dispersion with 21.95 g of a 16.4% Microlith Black CWA dispersion. 6.45 g of $H_2O$ and 50 g IPA were added to the mixture which was then coated onto a grained and anodised aluminium substrate to give a coat weight of 0.9 gm$^{-2}$ In this case, component A was a styrene/glycidyl methacrylate copolymer, and component B was the combination of the carboxylated acrylic resin associated with component A as the shell material, and the alkali-soluble binder associated with the carbon black pigment. The plate was exposed as in Example 1 to give an excellent image which after baking at 200° C. for two minutes gave greater than 100,000 impressions on a web offset press. The plates were stable on storage and the baking response was not diminished after many months.

EXAMPLE 7

414 ml of distilled water were placed in a 2 l flask equipped with stirrer, condenser, thermometer and $N_2$ inlet/exit. To the stirred water were added 85.8 ml of Carboset XL37. Then 16 ml of 25% aqueous ammonia were added. When a crystal clear solution was obtained, 150 g of styrene were added, followed by 1.5 g of ammonium persulphate in 10 ml distilled water. The mixture was maintained at 65° C. with vigorous stirring for a period of four hours to give a final product of solids content 25% w/w, with a particle size of less than 0.5 microns and a residual monomer content of 0.05% w/w. The final product was a core-shell dispersion composed of particles comprising a core of polystyrene and a shell of the carboxylated acrylic copolymer.

12 g of the core shell dispersion was mixed with 12.2 g of a 16.4% w/w Microlith Black CWA dispersion, 0.1 g Cymel 300 (Hexamethoxy methyl melamine from Cyanamid), 2.25 g distilled water and 25 g of IPA. The material was coated to give a 0.9 gm$^{-2}$ layer on a grained and anodised aluminium substrate. In this instance, component A was polystyrene, and component B was the combination of the carboxylated acrylic resin associated with component A as the shell material, the binder associated with the carbon black pigment, and the hexamethoxy methyl melamine crosslinking agent. The plate was exposed as in Example 1 and decoated with an aqueous solution of monoethanolamine (Electrosol 85, from DuPont-Howson) and baked for two minutes at 200° C. A very good quality image was obtained which showed exceptional solvent resistance.

EXAMPLE 8

414 cm$^3$ of distilled water was placed in a 2 l flask equipped as in Example 1.

85.8 cm$^3$ of Carboset XL37 and 16 cm$^3$ of 25% aqueous ammonia was added to the stirred water. When a clear solution was obtained 130 g of styrene, 20 g of Cylink IBMA Monomer (N-(isobutoxymethyl)acrylamide—supplied by American Cyanamid Company, Wayne, N.J.) and 6 g of bromotrichloromethane were added as a mixture. 1.5 g of ammonium persulphate in 10 cm$^3$ of water was added and the mixture was stirred for six hours at 65° C. under an atmosphere of nitrogen.

50 g of a coating solution was prepared by adding:

11 g of the above dispersion;

11 g of 16.4% w/w Microlith Black CWA;

15.5 g distilled water;

12.5 g of IPA and coated on a grained and anodised aluminium substrate to give a coat weight of 0.9 gm$^{-2}$. In this example, component A was a copolymer of styrene and N-(isobutoxymethyl) acrylamide, and component B was the combination of the carboxylated acrylic resin associated with component A as the shell material, and the binder associated with the carbon black pigment. The plate was exposed as in Example 1 and decoated with a sodium metasilicate-based developer to give an excellent quality image. After baking the material for two minutes at 200° C. the solvent resistant image was gummed and gave excellent durability when used on a web offset press.

The plates were storage stable and the baking response of imaged and decoated plates was not significantly diminished after many months storage.

EXAMPLE 9

Example 1 was repeated but the monomer mixture was now 7.5 g of Cylink IBMA and 67.5 g of styrene. Thus, component A in this case was a copolymer of styrene and N-(isobutoxymethyl)acrylamide, and component B was the alkali-soluble binder associated with the carbon black pigment. Excellent results were obtained.

EXAMPLE 10

Example 1 was repeated except that 3 g of Bisomer SEM (ammonium sulphato ethyl methacrylate aqueous solution from International Speciality Chemicals) was added. Components A and B were thus as in Example 1, but the incorporation of this reactive copolymerisable surfactant improved the colloidal stability of the latex—specially to alcohol additions and to coating aids.

EXAMPLE 11

A blocked isocyanate was prepared by reacting methyl ethyl ketone oxime with isocyanatoethyl methacrylate in anhydrous toluene. 10 g of the purified adduct were copolymerised with 65 g of styrene under identical conditions to those used in Example 1.

A 20% solids dispersion of the polymer was obtained.

A pigment dispersion was prepared by ball milling the following materials for forty hours

| | |
|---|---|
| Acrylsol I-62 (Hydroxy and carboxy functional acrylic resin as aqueous colloidal dispersion, 50% solids, available from Rohm and Haas, Philadelphia) | 40 g |
| FW2 carbon black (Degussa) | 20 g |
| Triethylamine | 4 g |
| Distilled Water | 250 g |

A coating was prepared from a dispersion consisting of:

13.5 g of the latex as prepared above;

14 g pigment dispersion as prepared above;

10 g distilled water;

12.5 g IPA;

This was coated on to a grained and anodised substrate to give a coat weight of 0.9 gm$^{-2}$. In this example, component A was a copolymer of styrene and the methyl ethyl ketone oxime/isocyanatoethyl methacrylate adduct, and component B was the hydroxy and carboxy-functional acrylic resin.

After exposing as in Example 1 an excellent image was obtained. The image was highly solvent resistant after baking for two minutes at 200° C.

EXAMPLES 12–21

Examples 1–10 were repeated except that an equivalent amount of the Acrylsol I-62 stabilised carbon black was used in place of Microlith Black CWA, with the consequent effect on the composition of component B. Excellent results were obtained.

EXAMPLES 22–25

Examples 1–4 were repeated except that half of the styrene was replaced by methyl methacrylate producing a styrene/methyl methacrylate/glycidyl methacrylate copolymer as component A. Good results were obtained.

EXAMPLES 26–29

Examples 1–4 were repeated except that half of the styrene was replaced by a 1:1 mixture of acrylonitrile and methyl methacrylate, producing a styrene/acrylonitrile methyl methacrylate/glycidyl methacrylate copolymer as component A.

EXAMPLES 30–33

Examples 1–4 were repeated except that half of the styrene was replaced by a 1:1 mixture of methyl methacrylate and butyl methacrylate, producing a styrene/methyl methacrylate/butyl methacrylate/glycidyl methacrylate copolymer as component A.

EXAMPLE 34

A solution of SQS (squarylium dye) in IPA was used in conjunction with the core shell latex of Example 6. Good results were obtained. The SQS acted as the IR absorbing component and was prepared as described in U.S. Pat. No. 4,508,811.

We claim:

1. A method of forming an image in a printing plate comprising the steps:
    (a) providing a radiation sensitive printing plate comprising a substrate coated with:
        (i) a coating comprising (1) a disperse water-insoluble heat-softenable phase A, and (2) a continouous binder phase B that is soluble or swellable in an aqueous medium; at least one of disperse phase A or continuous phase B having a reactive grouping, or precursor therefor, such that insolubilization of said coating occurs at elevated temperature and/or on exposure to actinic radiation, and
        (ii) a substance capable of strongly absorbing radiation and transferring the energy thus obtained as heat to the disperse phase so that at least partial coalescence of the coating occurs;
    (b) image-wise exposing the radiation sensitive plate to a beam of high intensity radiation, by directing the radiation at sequential areas of the coating and modulating the radiation so that the particles in the coating are selectively at least partially coalesced;
    (c) developing the image-wise exposed plate with aqueous medium to selectively remove the areas containing the non-coalesced particles and leave an image on the substrate resulting from the at least partially coalesced particles; and
    (d) heating the developed plate and/or subjecting it to actinic radiation to effect rapid reaction of said reactive grouping and insolubilization of said image.

2. A method as claimed in claim 1 wherein components A and B form a core-shell system.

3. A method as claimed in claim 1 wherein component A comprises one or more oleophilic polymers or oligomers, at least one of which contains reactive groupings or precursors.

4. A method as claimed in claim 1 wherein component B comprises an epoxy or polyether resin, or a polyurethane resin.

5. A method as claimed in claim 1 wherein component B comprises a polymer containing groups capable of conferring solubility or swellability in aqueous solutions.

6. A method as claimed in claim 5 wherein component B comprises a copolymer derived from the copolymerization of one or more ethylenically unsaturated carboxylic acids with one or more of styrene, (meth)acrylate esters, (meth)acrylonitrile or vinyl acetate.

7. A method as claimed in claim 5 wherein component B comprises a dicarboxylic acid half-ester of a hydroxyl group containing polymer.

8. A method as claimed in claim 5 wherein component B comprises a phthalic, succinic or maleic acid half ester of a polyvinyl acetal.

9. A method as claimed in claim 8 wherein the polyvinyl acetal is polyvinyl butyral.

10. A method as claimed in claim 5 wherein component B comprises an alkyl, an aralky half ester of a styrene or an alkyl vinyl ether-maleic anhydride copolymer.

11. A method as claimed in claim 1 wherein the weight ratio of component B to component A is in the range of from 1:20 to 20:1.

12. A method as claimed in claim 1 wherein the radiation absorbing substance comprises carbon black, graphite, phthalocyanine, croconium or squarylium dyestuffs.

13. The method of claim 1 wherein an alkaline aqueous medium is employed in step (c).

* * * * *

UNITED STATES PATENT AND TRADEMARK OFFICE
CERTIFICATE OF CORRECTION

PATENT NO. : 5,948,599
DATED : September 7, 1999
INVENTOR(S) : Alastair L. Gardner et al It is certified that error appears in the above-indentified patent and that said Letters Patent is hereby corrected as shown below:

Face of Patent, in first column, preceding section [21], insert
-- [73] Assignee: Agfa-Gevaert, N.V., Mortsel, Belgium --;

Face of Patent, in second column, following "Assistant Examiner - Laura Weiner", insert
-- Attorney, Agent or Firm - Breiner & Breiner --;

Column 1, line 9, "to form; printing images" should read
-- to form printing images --;

Column 7, line 4, "of the latex -- specially" should read
-- of the latex -- especially --.

Signed and Sealed this

First Day of August, 2000

Attest:

Q. TODD DICKINSON

*Attesting Officer*   *Director of Patents and Trademarks*